United States Patent
Lyu et al.

(10) Patent No.: US 7,169,477 B2
(45) Date of Patent: Jan. 30, 2007

(54) COMPOSITION FOR PREPARING POROUS DIELECTRIC THIN FILMS

(75) Inventors: Yi Yeol Lyu, Daejeon-Shi (KR); Kwang Hee Lee, Gyeonggi-Do (KR); Ji Man Kim, Gyeonggi-Do (KR); Seok Chang, Daejeon-Shi (KR); Jin Heong Yim, Daejeon-Shi (KR); Jae Geun Park, Daejeon-Shi (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 286 days.

(21) Appl. No.: 10/724,732

(22) Filed: Dec. 2, 2003

(65) Prior Publication Data

US 2004/0110854 A1   Jun. 10, 2004

(30) Foreign Application Priority Data

Dec. 3, 2002 (KR) .................... 10-2002-0076275

(51) Int. Cl.
*B32B 9/04* (2006.01)
*D05D 3/02* (2006.01)

(52) U.S. Cl. .................. 428/447; 525/477; 528/12; 528/21; 528/35; 528/37; 528/40; 528/43; 427/387; 428/822; 428/924; 428/931

(58) Field of Classification Search ............ 525/477; 528/12, 21, 35, 37, 40, 43; 427/387; 428/922, 428/924, 931

See application file for complete search history.

(56) References Cited

U.S. PATENT DOCUMENTS

| | | | |
|---|---|---|---|
| 3,615,272 A | 10/1971 | Collins et al. | |
| 4,399,266 A | 8/1983 | Matsumura et al. | |
| 4,999,397 A | 3/1991 | Weiss et al. | |
| 5,965,679 A | 10/1999 | Godschalx et al. | |
| 6,093,636 A | 7/2000 | Carter et al. | |
| 6,107,357 A | 8/2000 | Hawker et al. | |
| 6,231,989 B1 | 5/2001 | Chung et al. | |

*Primary Examiner*—Samuel A. Acquah
(74) *Attorney, Agent, or Firm*—Harness, Dickey & Pierce, P.L.C.

(57) ABSTRACT

The present invention provides a composition for preparing porous dielectric thin films containing pore-generating material, said composition comprising gemini detergent, and/or a quaternary alkyl ammonium salt, a thermo-stable organic or inorganic matrix precursor, and solvent for dissolving the two solid components. There is also provided an interlayer insulating film having good mechanical properties such as hardness, modulus and hydroscopicity, which is required for semiconductor devices.

16 Claims, No Drawings

COMPOSITION FOR PREPARING POROUS DIELECTRIC THIN FILMS

BACKGROUND OF THE INVENTION

This non-provisional application claims priority under 35 U.S.C. § 119(a) from Korean Patent Application No. 2002-762725 filed on Dec. 3, 2002, the subject matter of which is herein incorporated by reference.

FIELD OF THE INVENTION

The present invention relates to a composition for preparing a porous dielectric thin film containing novel pore-generating material. More specifically, the present invention is directed to a composition containing a siloxane-based gemini detergent, or a quaternary alkyl ammonium salt or mixtures thereof as a pore-generating material, for forming a porous interlayer dielectric thin film possessing good mechanical properties and hydroscopic resistance.

DESCRIPTION OF THE RELATED ART

Substances having nano-pores have been known to be useful as absorbents, carriers for catalysts, thermal insulators and electrical insulators in various fields. In particular, they have been recently reported to be useful as materials for insulating films between interconnecting layers of semiconductor devices. As the integration level has been increased in semiconductor devices, the performance of such devices is determined by the speed of the wires. Accordingly, the storage capacity of interconnecting thin films is required to be lowered to decrease the resistance and capacity in wires. For this purpose, there have been attempts to use materials with a low dielectric constant in the insulating film. For example, U.S. Pat. Nos. 3,615,272, 4,399,266 and 4,999,397 disclose polysilsesquioxanes with a dielectric constant of 2.5~3.1 which can be used in Spin-On-Deposition(SOD), as an alternative for $SiO_2$, with a dielectric constant of 4.0 which has been used in Chemical Vapor Deposition(CVD). In addition, U.S. Pat. No. 5,965,679 describes organic high molecules, e.g., polyphenylenes, with a dielectric constant of 2.65~2.70. However, the dielectric constants of the previous matrix materials are not sufficiently low to achieve a very low dielectric constant of less than 2.50, as required for high-speed devices.

To solve this problem, there have been various trials to incorporate air bubbles into these organic and inorganic matrixes, on a nano-scale. In this connection, U.S. Pat. No. 6,231,989 B1 describes the use of a lactone-based denriric polymer as a porogen, which may be decomposed by heating. Further, U.S. Pat. Nos. 6,107,357 and 6,093,636 disclose a method for preparing very low dielectric constant (k<3.0) substances comprising the steps of mixing a vinyl-based high molecular weight dendrimer pore-generating material such as a polystyrene, a polymethacrylate or a polyester, which are degradable in the heating step to form a thin film. The thin film is made by mixing these materials, and the like with a organic or inorganic matrix and decomposing the pore-generating materials contained in the mixture at a high temperature to form nano-pores.

SUMMARY OF THE INVENTION

According to the present invention, materials have been developed containing pores utilizing a gemini detergent and a quaternary alkyl ammonium salt as the pore-generating substance, said materials possessing a low dielectric constant, good physical and mechanical properties and good hygroscopic resistance.

In accordance with one aspect of the present invention, there is provided a composition for preparing a porous dielectric thin film, said composition comprising: (1) a pore generating material of a gemini detergent represented by the formula (8), or a quaternary alkyl ammonium salt represented by the formula(9) or a mixture thereof; (2) a thermo-stable organic or inorganic matrix precursor; and (3) a solvent for dissolving both the pore generating material and the matrix precursor.

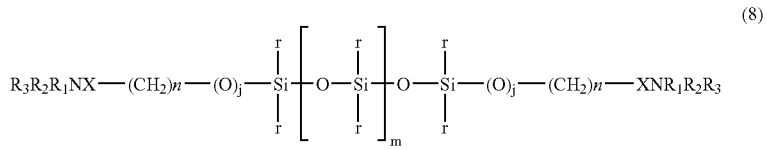

(8)

In the above formula(8),
$R_1$ and $R_2$ are independently a methyl group or an ethyl group,
$R_3$ is a $C_{5\sim40}$ alkyl group,
X is a halogen atom.
r is independently a hydrogen atom, a methyl group or a $C_{1\sim10}$ alkoxy group,
j is 0 or 1,
n is an integer from 1 to 12, and
m is an integer from 0 to 10.

$$NL_1L_2L_3L_4X \qquad (9)$$

In the above formula (9),
N is a nitrogen atom,
X is a halogen atom,
$L_1$, L2, $L_3$, and $L_4$ are independently a $C_{1\sim30}$ alkyl group.

In another aspect of the present invention, there is provided a method for forming interlayer insulating films between interconnecting layers of semiconductor devices, said method comprising coating the composition defined hereinabove on a substrate; evaporating the solvent from the substrate and heating the substrate at 150~600° C. under an inert gas atmosphere or under vacuum conditions.

Still another aspect of the present invention is to provide a porous material produced by the above composition.

Yet another aspect of the present invention is to provide a porous material which is effective as a heat resistant material, as an electrical insulator, as an absorbent, as a carrier for catalysts, and the like.

The thermo-stable matrix precursors used in the composition of the present invention may be organic or inorganic high molecular weight materials having a glass transition temperature higher than 400° C.

Examples of the inorganic high molecular weight materials include, without limitation, (1) silsesquioxane, (2) alkoxy silane sol with a number average molecular weight of 500~20,000, derived from the partial condensation of a silane monomer such as $SiOR_4$, $RSiOR_3$ or $R_2SiOR_2$ (R is an organic substituent), etc., and (3) a polysiloxane with a number average molecular weight of 1000~1,000,000, derived from the partial condensation of at least one kind of cyclic or cage structure-siloxane monomer such as $SiOR_4$, $RSiOR_3$ or $R_2SiOR_2$ (R is an organic substituent).

Advantageously, the silsesquioxane can be exemplified by hydrogen silsesquioxane, alkyl silsesquioxane, aryl silsesquioxane, and copolymers of these silsesquioxanes.

In addition, organic high molecules, which cure into stable reticular structures at a high temperature, are also preferred as the matrix precursor. Non-limiting examples of high molecular weight organic molecular include polyimide-based polymers, which can undergo imidization, such as poly (amic acid), poly (amic acid ester), etc.; polybenzocyclobutene-based polymers; and polyarylene-based polymers such as polyphenylene, poly (arylene ether), etc.

In the present invention, a preferred matrix precursor is an organic polysiloxane, which has good solubility and at least 10 mol %, preferably 25 mol % or more of Si—OH content. The organic polysiloxane is prepared through hydrolysis and polycondensation of siloxane monomers having cyclic or cage structures selectively mixed with a silane monomer such as $SiOR_4$, $RSiOR_3$ or $R_2SiOR_2$ in a solvent in the present of acidic catalyst and water in the presence of a solvent. When silane monomers are mixed, the ratio of siloxane monomers having either cyclic or cage structure to the silane monomer is 0.99:0.01~0.01:0.99, preferably 0.8: 0.2~0.1:0.9, more preferably 0.6:0.4~0.2:0.8.

Siloxane monomers having a cyclic structure can be represented by the formula (1).

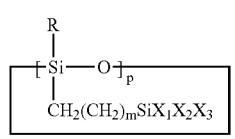

(1)

In the above formula (1),

R is a hydrogen atom, a $C_{1-3}$ alkyl group, a $C_{3-10}$ cycloalkyl group, or a $C_{6-15}$ aryl group;

$X_1$, $X_2$ and $X_3$ are independently a $C_{1-3}$ alkyl group, a $C_{1-10}$ alkoxy group, or a halogen atom, at least one being hydrolysable;

p is an integer ranging from 3 to 8; and m is an integer ranging from 0 to 10.

As can be seen from the above formula (1), silicon atoms are linked to each other through oxygen atoms to form the cyclic structure, and the end of each branch comprises organic groups constituting the hydrolyzable substituent.

The method for preparing the cyclic siloxane monomers is not specifically limited, but a hydrosililation reaction using a metal catalyst is preferred.

The siloxane monomer having cage structure can be represented by the following formulas (2) to (4).

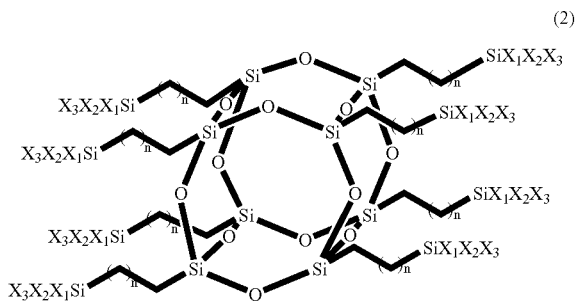

(2)

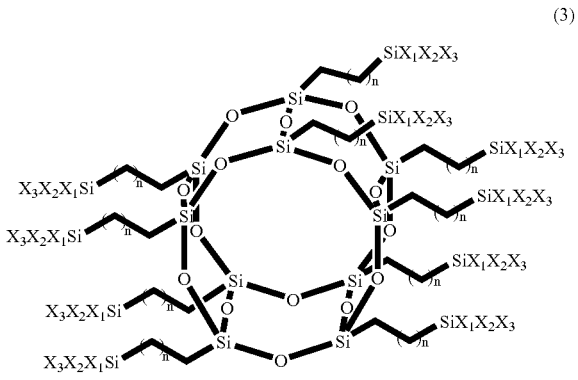

(3)

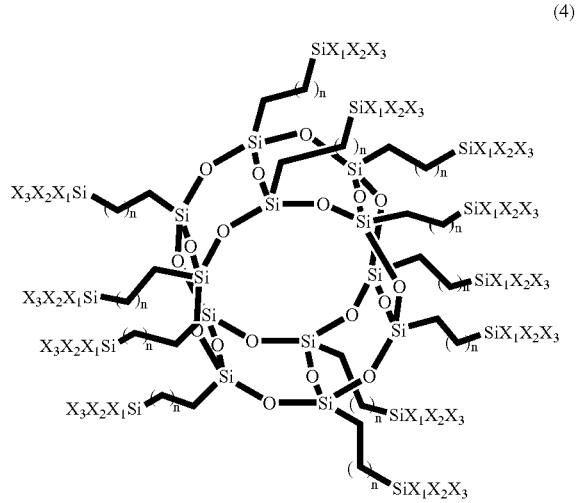

(4)

In the above formulas (2) to (4), $X_1$, $X_2$ and $X_3$ are independently a hydrogen atom, a $C_{1-3}$ alkyl group, a $C_{1-10}$ alkoxy group, or a halogen atom, at least one being hydrolyzable and;

n is an integer from 1 to 10.

The method of preparing siloxane monomers having the cage structure is not specially limited, and can be prepared by hydrosililation using metallic catalyst as previously known methods in the art.

The silane-based monomers can be represented by the following formulas (5)~(7).

$SiX_1X_2X_3X_4$ (5)

$RSiX_1X_2X_3$ (6)

$R_1R_2Si\ X_1X_2$ (7)

In the above formulas (5) to (7),

R is hydrogen atom, a $C_{1-3}$ alkyl group, a $C_{3-10}$ cycloalkyl group, or a $C_{6-15}$ aryl group; and $X_1$, $X_2$ and $X_3$ are independently a $C_{1\sim10}$ alkoxy group, or a halogen atom.

The catalyst used in the condensation reaction for preparing the matrix precursor is not specifically limited, but preferably includes hydrochloric acid, benzenesulfonic acid, oxalic acid, formic acid, or a mixture thereof.

In the hydrolysis and polycondensation reaction, water is added at 1.0~100.0 equivalents, preferably 1.0~10.0 equivalents per one equivalent of reactive groups in the monomers, and then the reaction is carried out at 0~200° C., preferably 50~110° C., for 1~100 hrs, preferably 5~24 hrs.

The organic solvent used in this reaction is preferably an aromatic hydrocarbon solvent such as toluene, xylene, mesitylene, etc.; ketone-based solvents such as methyl isobutyl ketone, acetone, etc.; ether-based solvent such as tetrahydrofuran, isopropyl ether, etc.; acetate-based solvents such as propylene glycol monomethyl ether acetate; amide-based solvents such as dimethylacetamide, dimethylformamide, etc.; γ-butyrolactone; silicon solvents or a mixture thereof.

The thermo-unstable pore-generating materials used in the present invention are gemini detergents represented by the formula(8), quaternary alkyl ammonium salts represented by the formula(9) or a mixture thereof.

$$R_3R_2R_1NX-(CH_2)_n-(O)_j-Si\begin{bmatrix}r\\|\\r\end{bmatrix}-O-Si\begin{bmatrix}r\\|\\r\end{bmatrix}_m-O-Si\begin{bmatrix}r\\|\\r\end{bmatrix}-(O)_j-(CH_2)_n-XNR_1R_2R_3 \quad (8)$$

In the above formula (8), $R_1$ and $R_2$ are independently methyl groups or ethyl groups;

$R_3$ is a $C_{5\sim40}$ alkyl group;

X is a halogen atom;

r is independently a hydrogen atom, a methyl group or a $C_{1\sim10}$ alkoxy group;

j is 0 or 1;

n is an integer from 1 to 12; and m is an integer from 0 to 10.

$$NL_1L_2L_3L_4X \quad (9)$$

In the above formula (9),

N is nitrogen atom;

X is halogen atom; and $L_1$, $L_2$, $L_3$, and $L_4$ are independently $C_{1\sim30}$ alkyl groups.

The gemini detergent above is prepared by the reaction of the materials represented by formula(10) and formula (11) in a solvent such as ethanol, acetonitrile, toluene, etc. at the temperature of 30° C.~120° C., preferably 60° C.~90° C. for 1~100 hr, preferably for 24~72.

$$X-(CH_2)_n-(O)_j-Si\begin{bmatrix}r\\|\\r\end{bmatrix}-O-Si\begin{bmatrix}r\\|\\r\end{bmatrix}_m-O-Si\begin{bmatrix}r\\|\\r\end{bmatrix}-(O)_j-(CH_2)_n-X \quad (10)$$

In the above formula (10),

X is a halogen atom;

r is independently a hydrogen atom, a methyl group or a $C_{1\sim10}$ alkoxy group, j is 0 or 1;

n is an integer from 1 to 12; and m is an integer from 0 to 10

$$R_3R_2R_1N \quad (11)$$

In the above formula (11), $R_1$ and $R_2$ are independently a methyl group or a ethyl group; and $R_3$ is a $C_{5\sim40}$ alkyl group.

In this reaction, the mole ratio of the material represented by formula (10) to that of formula (11) is 1:2~1:3.

The quaternary alkyl ammonate can be obtained commercially, and particular examples thereof include, but are not limited to, tetramethylammonium bromide, tetraethylammonium bromide, tetrapropylammonium bromide, tetrabutylammonium bromide, tetrapentylammonium bromide, tetrahexylammonium bromide, tetraheptylammonium bromide, tetraoctylammonium bromide, tetrahexadecylammonium bromide, tetraoctadecylammonium bromide, diethyldimethylammonium bromide, dipropyldimethylammonium bromide, dibutyldimethylammonium bromide, dipentyldimethylammonium bromide, dihexyldimethylammonium bromide, diheptyldimethylammonium bromide, dioctyldimethylammonium bromide, didecyldimethylammonium bromide, etc.

In the composition of the present invention, a cyclodextrin-based derivative represented by the following formula (12) may be further added in addition to the gemini detergent, the quaternary alkyl ammonate, or a mixture thereof, as a porogen in order to improve the dielectric constant and to elevate hygroscopicity.

(12)

In the above formula (12), q is an integer ranging from 6 to 12;

$R_1$, $R_2$ and $R_3$ are independently a halogen atom, a $C_{0\sim10}$ amino group or a azido group, a $C_{3\sim20}$ imidazole group or a pyridino group, a $C_{1\sim10}$ cyano group, a $C_{2\sim10}$ carbonate group, a $C_{1\sim10}$ carbamate group, or $-OR_4$, wherein $R_4$ is a hydrogen atom, a $C_{2\sim30}$ acyl group, a $C_{1\sim20}$ alkyl group, a $C_{3\sim10}$ alkene group, a $C_{3\sim20}$ alkyne group, a $C_{7\sim20}$ tosyl group, a $C_{1\sim10}$ mesyl group, a $C_{0\sim10}$ phosphorous group, a $C_{3\sim10}$ cycloalkyl group, a $C_{6\sim30}$ aryl group, a $C_{1\sim20}$ hydroxy alkyl group, or a carboxyl group, a $C_{1\sim20}$ carboxy alkyl group, a glucosyl group or a maltosyl group, or a silicon compound represented by $Sir_1r_2r_3$, wherein $r_1$, $r_2$ and $r_3$ are independently a $C_{1\sim5}$ alkyl group, a $C_{1\sim5}$ alkoxy group, or a $C_{6\sim20}$ aryl group.

Examples of the pore-generating material used in the present invention include α-, β- and γ- cyclodextrins represented by the following formulas (13) to (15), all of which have a limited 3D structure with a maximum radius of about 13~17 Å.

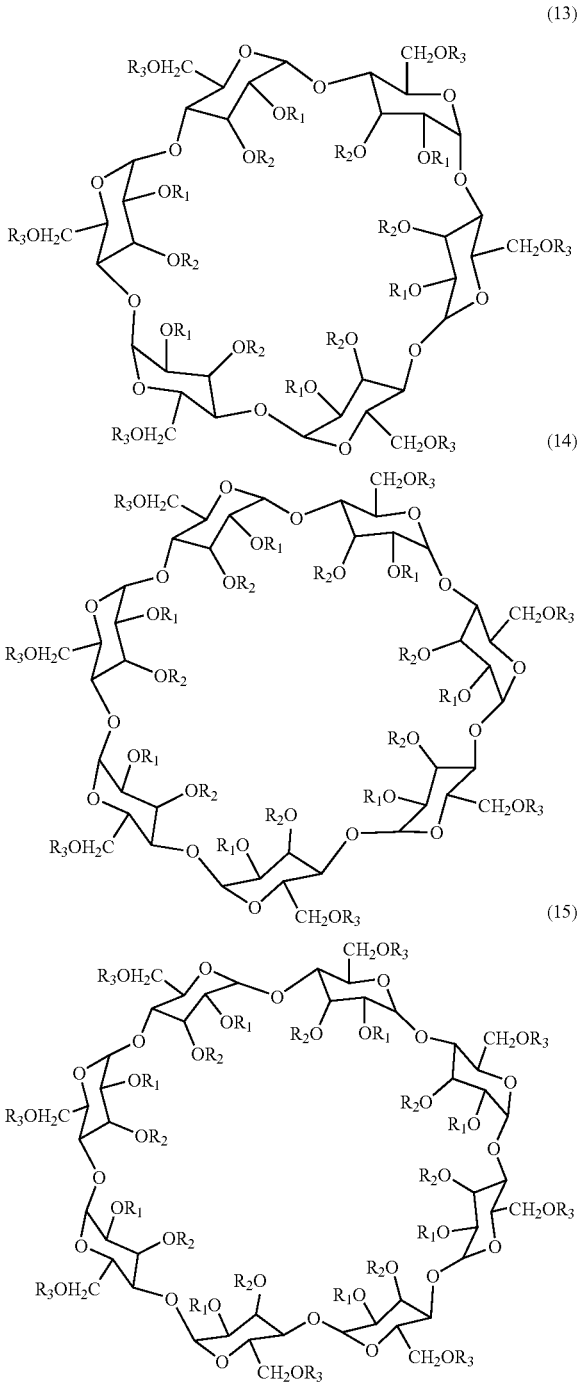

In the above formulas (13) to (15);

$R_1$, $R_2$ and $R_3$ are the same as those determined in the formula (12).

In the above α-, β- and γ- cyclodextrin derivatives, $R_1$, $R_2$ and $R_3$ are preferably a $C_{2\sim30}$ acyl group, a $C_{1\sim20}$ alkyl group, a $C_{3\sim10}$ alkene group, a $C_{3\sim20}$ alkyne group, a $C_{3\sim10}$ cycloalkyl group, a $C_{6\sim30}$ aryl group, or a silicon compound represented by $Sir_1r_2r_3$, wherein $r_1$, $r_2$ and $r_3$ are independently a $C_{1\sim5}$ alkyl group, a $C_{1\sim5}$ alkoxy group, or a $C_{6\sim20}$ aryl group.

Specific examples of the cyclodextrin derivatives include, but are not limited to, hexakis (2,3,6-tri-O-acetyl)-α-cyclodextrin, heptakis (2,3,6-tri-O-acetyl)-β-cyclodextrin, octakis (2,3,6-tri-O-acetyl)-γ-cyclodextrin, heptakis (2,3,6-tri-O-propanoyl)-β-cyclodextrin, heptakis (2,3,6-tri-O-butanoyl)-β-cyclodextrin, heptakis (2,3,6-tri-O-pentanoyl)-β-cyclodextrin, hexakis (2,3,6-tri-O-benzoyl)-α-cyclodextrin, heptakis (2,3,6-tri-O-benzoyl)-β-cyclodextrin, octakis (2,3,6-tri-O-benzoyl)-γ-cyclodextrin, hexakis(2,3,6-tri-O-methyl)-α-cyclodextrin, heptakis(2,3,6-tri-O-methyl)-β-cyclodextrin, hexakis(6-O-tosyl)-α-cyclodextrin, hexakis(6-amino-6-O-deoxy)-α-cyclodextrin, heptakis(6-amino-6-deoxy)-β-cyclodextrin, bis(6-azido-6-deoxy)-β-cyclodextrin, hexakis(2,3-O-acetyl-6-bromo-6-deoxy)-α-cyclodextrin, heptakis(2,3-O-acetyl-6-bromo-6-deoxy)-β-cyclodextrin, mono(2-O-phosphoryl)-α-cyclodextrin, mono (2-O-phosphoryl)-β-cyclodextrin, hexakis(6-deoxy-6-(1-imdazolyl))-β-cyclodextrin, and mono(2(3)-O-carboxymethyl)-α-cyclodextrin, heptakis(2,3,6-tri-O-trimethylsilyl)-β-cyclodextrin, heptakis(2,3,6-tri-O-dimethylsilyl)-β-cyclodextrin, etc.

The content of the cyclodextrin derivative is preferably 5.0~95 wt. %, more preferably 20~80 wt. % of the entire pore-generating material.

In the present invention, the composition for producing substances having pores may be prepared by dissolving the above mentioned thermo-stable matrix precursor and the thermo-unstable pore-generating material in an appropriate solvent.

Examples of this solvent include, but not limited to, aromatic hydrocarbons such as anisole, mesitylene and xylene; ketones such as methyl isobutyl ketone and acetone; ethers such as tetrahydrofuran and isopropyl ether; acetates such as propylene glycol methyl ether acetate; amides such as dimethylacetamide and dimethylformamide; γ-butyolactone; silicon solvents; and a mixture thereof.

The solvent should be used in an amount sufficient to coat a substrate fully with the two solid components (matrix precursor+cyclodextrin derivative), and may be present in the range of 20~99.9 wt. %, preferably 50~95wt. %, in the composition (matrix precursor+pore-generating material+solvent). There is a problem in forming a uniform thin film if the solvent is used in an amount of less than 20 wt. % because of high viscosity. On the contrary, the thickness becomes too thin if the solvent is used in an amount of more than 99.9 wt. %.

The content of the pore-generating material is preferably 0.1~95 wt. %, more preferably 10~70 wt. % of the solid components (matrix precursor+pore-generating material). There is the problem that the mechanical properties of the film will deteriorate if the pore-generating material is used in an amount of more than 95 wt. %. To the contrary, the dielectric constant of the film will not be reduced due to the poor formation of pores if the pore-generating material is used is an amount of less than 10 wt. %.

According to the present invention, a thin film having pores formed on a substrate, using the composition of the present invention serves as a good interlayer insulating film required in semiconductor devices. The composition of the present invention is first coated onto a substrate through spin-coating, dip-coating, spray-coating, flow-coating, screen-printing and so on. More preferably, the coating step is carried out by spin-coating at 1000~5000 rpm. Following the coating, the solvent is evaporated from the substrate leaving a resinous film deposited on the substrate. At this time, the evaporation may be carried out by simple air-drying, or by subjecting the substrate, at the beginning of curing step, to vacuum conditions or mild heating (<100° C.).

The resulting resinous coating film may be cured by heating at a temperature of 150~600° C., more preferably 200~450° C. wherein pyrolysis of the pore-generating material occurs, to provide an insoluble film substantially free of cracks. As used herein, "film substantially free of cracks" is meant a film without observed cracks with an optical microscope at a magnification of 1000×. As used herein, by "insoluble film" is meant a film, which is substantially insoluble in any solvent described as being useful for the coating and deposition of the siloxane-based resin. The heat-curing of the coating film may be performed under an inert gas atmosphere or vacuum conditions for about 10 hrs, preferably 30 min to 1 hr. After the curing process, pore-generating materials are decomposed to generate the pores.

The thin film obtained from above has a low dielectric constant (k<2.5). Further, in the case where about 30 parts by weight of the cyclodextrin-based pore-generating material are mixed with 70 parts by weight of the matrix precursor (i.e., the content of the porogen is 30 wt. % of the solid mixture), a very low dielectric constant (k<2.2) may be also achieved.

Material with pores generated by the above compositions have a variety of applications, for example as absorbents, carriers for catalysts, thermal insulators, electrical insulators and low dielectric materials.

Hereinafter, the present invention will be described in more detail with reference to the following Examples. However, these Examples are given for the purpose of illustration only thus should not be construed as limiting the scope of the present invention.

EXAMPLE 1

Synthesis of Matrix Monomers

EXAMPLE 1-1

Synthesis of Matrix Monomer A

To a flask is added 29.014 mmol(10.0 g) of 2,4,6,8-tetramethyl-2,4,6,8-tetravinylcyclotetrasiloxane and 0.164 g of platinum (O)-1,3-divinyl-1,1,3,3-tetramethyldisiloxane complex(solution in xylene), and then diluted with 300 ml of diethylether. Next, the flask is cooled to −78° C., 127.66 mmol(17.29 g) trichlorosilane is slowly added thereto, and then it is slowly warmed to room temperature. The reaction is continued at room temperature for 20 hrs, and any volatile materials are removed from the reaction mixture under reduced pressure of about 0.1 torr. To the mixture is added 100 ml pentane and stirred for 1 hr, and then the mixture is filtered through celite to provide a clear colorless solution. The pentane is evaporated from the solution under reduced pressure of about 0.1 torr to produce a colorless liquid compound, [—Si(CH$_3$)(CH$_2$CH$_2$Cl$_3$)O—]$_4$ in a yield of 95%.

11.28 mmol(10.0 g) of the compound is diluted with 500 ml of tetrahydrofuran, and 136.71 mmol(13.83 g) of triethylamine is added thereto. Thereafter, the mixture is cooled to −78° C., 136.71 mmol(4.38 g) of methyl alcohol is slowly added thereto, and it is slowly warmed again to room temperature. The reaction is continued at room temperature for 15 hrs, filtered through celite, and then volatile materials are evaporated from the filtrate under reduced pressure of about 0.1 torr. Subsequently, 100 ml of pentane is added thereto and stirred for 1 hr, and then the mixture is filtered through celite to provide a clear colorless solution. The pentane is evaporated from this solution under reduced pressure of about 0.1 torr to produce monomer A represented by the following formula (11) as a colorless liquid in a yield of 94%:

(11)

EXAMPLE 2

Synthesis of Matrix Precursors

EXAMPLE 2-1

Precursor A: Homopolymerization of Monomer A

To a flask is added 9.85 mmol(8.218 g) of monomer A, and then diluted with 90 ml of tetrahydrofuran. Next, dil. HCl solution (1.18 mmol hydrochloride) prepared by mixing 8.8 ml conc. HCl (35 wt. % hydrochloride) with 100 ml D.I.-water is slowly added thereto at −78° C., followed by the addition of more D.I.-water, so that the total amount of water including the inherent water in the above added dil. HCl solution amounted to 393.61 mmol(7.084 g). Thereafter, the flask is slowly warmed to 70° C., and allowed to react for 16 hrs. Then, the reaction mixture is transferred to a separatory funnel and 90 ml of diethylether is added thereto, and then rinsed with 5×100 ml D.I.-water. Subsequently, 5 g of anhydrous sodium sulfate is added thereto and stirred at room temperature for 10 hrs to remove any trace of water, and then filtered to provide a clear, colorless solution. Any volatile materials are evaporated from this solution under reduced pressure of about 0.1 torr to afford 5.3 g of precursor A as white powder.

EXAMPLE 2-2

Precursor B: Copolymerization of Monomer A and Methyltrimethoxysilane

To a flask is added 37.86 mmol(5.158 g) of methyltrimethoxysilane and 3.79 mmol(3.162 g) of monomer A, and then diluted with 100 ml of tetrahydrofuran. Next, dil. HCl solution (0.0159 mmol hydrochloride) prepared by dilution of 0.12 ml conc. HCl (35 wt. % hydrochloride) with 100 ml D.I.-water is slowly added thereto at −78° C., followed by the addition of more D.I.-water, so that the total amount of water including the inherent water in the above added dil. HCl solution amounted to 529.67 mmol(9.534 g). Thereafter, the flask is slowly warmed to 70° C., and allowed to react for 16 hrs. Then, the reaction mixture is transferred to a separatory funnel, 100 ml diethylether is added thereto, and then rinsed with 5×100 ml D.I.-water. Subsequently, 5 g of anhydrous sodium sulfate was added thereto and stirred at room temperature for 10 hrs to remove a trace of water, and then filtered out to provide a clear colorless solution. Volatile materials are evaporated from this solution under reduced pressure of about 0.1 torr to afford 5.5 g of precursor B as a white powder.

EXAMPLE 3

Analysis of the Matrix Precursors

The siloxane-based resinous precursors thus prepared are analyzed for molecular weight (hereinafter, referred to as "MW") and molecular weight distribution (hereinafter, referred to as "MWD") by means of gel permeation chromatography (Waters Co.), and the Si—OH, Si—OCH$_3$ and Si—CH$_3$ contents (%) of their terminal groups are analyzed by means of NMR (Bruker Co.). The results are set forth in the following Table 1.

TABLE 1

| Precursor | MW | MWD | Si—OH (mol %) | Si—OCH$_3$ (mol %) | Si—CH$_3$ (mol %) |
|---|---|---|---|---|---|
| Precursor (A) | 60800 | 6.14 | 35.0 | 1.2 | 63.8 |
| Precursor (B) | 4020 | 2.77 | 39.8 | 0.5 | 59.7 |

Si—OH(%) = Area(Si—OH) ÷ [Area(Si—OH) + Area(Si—OCH$_3$)/3 + Area(Si—CH$_3$)/3] × 100
Si—OCH$_3$(%) = Area(Si—OCH$_3$) ÷ [Area(Si—OH) + Area(Si—OCH$_3$)/3 + Area(Si—CH$_3$)/3] × 100
Si—CH$_3$(%) = Area(Si—CH$_3$) ÷ [Area(Si—OH) + Area(Si—OCH$_3$)/3 + Area (Si—CH$_3$)/3] × 100

EXAMPLE 4

Preparing the Pore-Generating Material

EXAMPLE 4-1

Gemini Detergent Pore-Generating Material(a-1)

In a flask are mixed 100 ml acetonitrile and 10.0 g of bis(chloromethyl) tetramethyldisiloxane (A), and then 21.4 g of tetradecyldimethylamine (n=14, B) is added. The mole ratio of A to B was set to 1:2.05. The obtained solution was heated at 82° C., for 24 hr in a reflux condition. The rotary evaporator removed the solvent, acetonitrile to provide a solid- form product. The solid product is dissolved in 2 ml of chloroform, and 500 ml of ethyl acetate is added thereto. Subsequently, the solution is retained at 0° C., for 12 hr to achieve recrystallization. The recrystallized material is filtered and rinsed 3× with ethylacetate. Recrystallization, filtering, and rinsing are repeated two more times. The solvent is evaporated completely from the material obtained above by drying in a vacuum oven at 50° C., for 12 hr to prepare C$_{14}$H$_{29}$N(CH$_3$)$_2$CH$_2$Si(CH$_3$)$_2$OSi(CH$_3$)$_2$CH$_2$N(CH$_3$)$_2$Cl$_{14}$H$_{29}$Cl.

EXAMPLE 4-2

Gemini Detergent Pore-Generating Material (a-2)

In a flask is mixed 200 ml of ethanol and 7.24 g of BrCH$_2$CH$_2$CH$_2$OSi(CH$_3$)$_2$OSi(CH$_3$)$_2$OSi(CH$_3$)$_2$OCH$_2$CH$_2$CH$_2$Br(A), and then 9.15 g of octadecyldimethylamine(B) is added thereto. The mole ratio of A to B is set to 1:2.05 in the reactants. The obtained solution is heated for 48 hr under reflux conditions. The solvent, ethanol is removed by the rotary evaporator to provide a solid- form product. The solid component is added to 2 ml chloroform and dissolved, and then 500 ml of ethyl acetate is added. Subsequently, the solution is retained at 0° C., for 12 hr to achieve recrystallization. Recrystallized materials are filtered, and rinsed 3× with ethylacetate. Recrystallization, filtering, and rinsing are repeated two more times. The solvent is evaporated completely from the material obtained above by vacuum oven at 50° C., for 12 hr to prepare C$_{18}$H$_{37}$N(CH$_3$)$_2$BrCH$_2$CH$_2$CH$_2$OSi(CH$_3$)$_2$OSi(CH$_3$)$_2$OSi(CH$_3$)$_2$OCH$_2$CH$_2$CH$_2$BrN(CH$_3$)$_2$C$_{18}$H$_{37}$.

Example 5

Determination of Thickness and Refractive Index of the Thin Film Substance Containing Nano-Pores The compositions for preparing a thin film are prepared by mixing the siloxane-based resinous matrix precursor obtained from the above Example 2 together with pore-generating material and propylene glycol methyl ether acetate (PGMEA) in accordance with the particular ratios as described in the following Table 2. These compositions are applied to spin-coating at 3000 rpm onto p-type silicon wafers doped with boron. The substrates thus coated are then subjected to a series of soft baking on a hot plate for 1 min at 150° C. and for an additional minute at 250° C., so that the organic solvent can be sufficiently removed. Then, the substrates are cured in a Linberg furnace at 420° C. for 60 min under vacuum conditions. Thereafter, the thickness of each resulting low dielectric film and the refractive index are determined by using a prism coupler. The results are set forth in the following Table 2.

TABLE 2

| Example No. | Precursor | Pore-generating material | Mat.[1] (wt. %) | Pore-generating[2] material (wt. %) | Thickness (Å) | Refractive Index |
|---|---|---|---|---|---|---|
| Example 5-1 | Precursor (A) | — | 25.0 | — | 8250 | 1.4353 |
| Example 5-2 | Precursor (A) | | 25.0 | 20 wt. % | 10200 | 1.3760 |
| Example 5-3 | Precursor (A) | (a – 2) | 25.0 | 20 wt. % | 9800 | 2.3646 |
| Example 5-4 | Precursor (A) | (a – 1) + (b – 2) | 25.0 | (a – 1): 10 wt. % + (b – 2): 20 wt. % | 10300 | 1.3360 |
| Example 5-5 | Precursor (A) | (a – 1) + (c) | 25.0 | (a – 1): 20 wt. % + (c): 10 wt. % | 9500 | 1.3360 |

TABLE 2-continued

| Example No. | Precursor | Pore-generating material | Mat.[1] (wt. %) | Pore-generating[2] material (wt. %) | Thickness (Å) | Refractive Index |
|---|---|---|---|---|---|---|
| Example 5-6 | Precursor (A) | (a – 1) + (c) | 25.0 | (a – 1): 10 wt. % + (c): 20 wt. % | 9900 | 1.3296 |
| Example 5-7 | Precursor (A) | (a – 2) + (c) | 25.0 | (a – 2): 10 wt. % + (c): 20 wt. % | 10050 | 1.3382 |
| Example 5-8 | Precursor (B) | — | 30.0 | — | 9800 | 1.4147 |
| Example 5-9 | Precursor (B) | (a – 1) | 30.0 | 20 wt. % | 11030 | 1.3379 |
| Example 5-10 | Precursor (B) | (a – 1) | 30.0 | 30 wt. % | 11500 | 1.3011 |
| Example 5-11 | Precursor (B) | (a – 1) + (b – 1) | 30.0 | (a – 1): 10 wt. % + (b – 1): 20 wt. % | 11000 | 1.3087 |
| Example 5-12 | Precursor (B) | (a – 1) + (c) | 30.0 | (a – 1): 10 wt. % + (c): 20 wt. % | 10700 | 1.3077 |
| Example 5-13 | Precursor (B) | (a – 1) + (c) | 30.0 | (a – 1): 10 wt. % + (c): 20 wt. % | 11200 | 1.3144 |
| Example 5-14 | Precursor (A) | (b – 1) | 30.0 | 20 wt. % | 9500 | 1.3314 |
| Example 5-15 | Precursor (A) | (b – 1) + (c) | 30.0 | (b – 1): 10 wt. % + (c): 20 wt. % | 9400 | 1.3297 |
| Example 5-16 | Precursor (B) | (b – 1) | 30.0 | 20 wt. % | 9600 | 1.3378 |
| Example 5-17 | Precursor (B) | (b – 1) + (c) | 30.0 | (b – 1): 10 wt. % + (c ): 20 wt. % | 11000 | 1.3110 |

Mat.[1](Wt. %) = [weight of matrix precursor (g) + weight of pore-generating material (g)/[weight of PGMEA (g) + weight of matrix precursor (g) + weight of pore-generating material (g)] × 100
Pore-generating material[2](wt. %) = weight of pore-generating material (g)/[weight of pore-generating material (g) + weight of matrix precursor (g)] × 100
Pore-generating material(b – 1): tetrahexylammonium bromide, purchased from Sigma Aldrich Co. and used without any purification.
Pore-generating material(b – 2): didecyldimethylammonium bromide, purchased from Sigma Aldrich Co. and used without any purification.
Pore-generating material(c): heptakis(2, 4, 6-tri-O-methyl)-β-cyclodextrin, purchased from Sigma Aldrich co. and used without any purification.

EXAMPLE 6

Preparing the Thin Film Determiner of a Dielectric Constant and Determination of the Dielectric Constant To determine the dielectric constant of the porous thin film, 3000 Å thickness of thermally-oxidized silicon film are applied onto p-type silicon wafers doped with boron, then 100 Å titanium, 2000 Å aluminum are deposited by metal evaporator and then the low dielectric films of the compositions of Table 3 are coated in the same manner as in Example 5. Thereafter, 1 mm diameter of circular aluminum thin film is deposited at 2000 Å thickness by a hard mask, which is designed to have a 1 mm electrode diameter, in order to be completed MIM(Metal-insulator-metal)-dielectric constant determiner capacitance of these thin films is measured using PRECISION LCR METER (HP4284A) with Probe station (Micromanipulator 6200 probe station) at 100 Hz frequency. The thickness of the thin films is also measured using a prism coupler. The dielectric constant is measured according to the following equation.

$$k=(C \times d)/(\epsilon_0 \times A)$$

k: dielectric constant
C: capacitance
A: the contact area of electrode
$\epsilon_0$: dielectric constant of vacuum
d: the thickness of the low dielectric thin film

TABLE 3

| Example No. | Precursor | Pore-generating material | Mat.[1] (wt. %) | Pore-generating[2] material (wt. %) | Dielectric constant |
|---|---|---|---|---|---|
| Example 6-1 | Precursor (A) | — | 25.0 | — | 2.715 |
| Example 6-2 | Precursor (A) | (a – 1) | 25.0 | 20 wt. % | 2.398 |
| Example 6-3 | Precursor (A) | (a – 2) | 25.0 | 20 wt. % | 2.369 |
| Example 6-4 | Precursor (A) | (a – 1) + (b – 2) | 25.0 | (a – 1): 10 wt. % + (b – 2): 20 wt. % | 2.226 |
| Example 6-5 | Precursor (A) | (a – 1) + (c) | 25.0 | (a – 1): 20 wt. % + (c): 10 wt. % | 2.201 |
| Example 6-6 | Precursor (A) | (a – 1) + (c) | 25.0 | (a – 1): 10 wt. % + (c): 20 wt. % | 2.196 |
| Example 6-7 | Precursor (A) | (a – 2) + (c) | 25.0 | (a – 2): 10 wt. % + (c): 20 wt. % | 2.237 |
| Example 6-8 | Precursor (B) | — | 30.0 | — | 3.653 |
| Example 6-9 | Precursor (B) | (a – 1) | 30.0 | 20 wt. % | 2.353 |
| Example 6-10 | Precursor (B) | (a – 1) | 30.0 | 30 wt. % | 2.202 |

TABLE 3-continued

| Example No. | Precursor | Pore-generating material | Mat.[1] (wt. %) | Pore-generating[2] material (wt. %) | Dielectric constant |
|---|---|---|---|---|---|
| Example 6-11 | Precursor (B) | (a − 1) + (b − 1) | 30.0 | (a − 1): 10 wt. % + (b − 1): 20 wt. % | 2.184 |
| Example 6-12 | Precursor (B) | (a − 1) + (c) | 30.0 | (a − 1): 10 wt. % + (c): 20 wt. % | 2.102 |
| Example 6-13 | Precursor (B) | (a − 1) + (c) | 30.0 | (a − 1): 20 wt. % + (c): 10 wt. % | 2.178 |
| Example 6-14 | Precursor (A) | (b − 1) | 30.0 | 20 wt. % | 2.314 |
| Example 6-15 | Precursor (A) | (b − 1) + (c) | 30.0 | (b − 1): 10 wt. % + (c): 20 wt. % | 2.204 |
| Example 6-16 | Precursor (B) | (b − 1) | 30.0 | 20 wt. % | 2.317 |
| Example 6-17 | Precursor (B) | (b − 1) + (c) | 30.0 | (b − 1): 10 wt. % + (c): 20 wt. % | 2.191 |

Mat.[1](Wt. %) = [weight of matrix precursor (g) + weight of pore-generating material (g)/[weight of PGMEA (g) + weight of matrix precursor (g) + weight of pore-generating material (g)] × 100
Pore-generating material[2](wt. %) = weight of pore-generating material (g)/[weight of pore-generating material (g) + weight of matrix precursor (g)] × 100

EXAMPLE 7

Measurement of Hydroscopicity of the Thin Film

To measure the hydroscopic degree of the porous thin films, the prepared determiner-thin films prepared in Example 5 are put in D.I.water for 4 days. the film is taken out, and then water is removed from the thin film by blowing the film with nitrogen for 1 min. Thereafter, the hydroscopicity is measured through the variation of capacitance which was gauged at 100 khz frequency using a PRECISION LCR METER (HP4284A) with a Probe station (Micromanipulator 6200 probe station).

Generally, if an adsorption happens, the capacitance adsorption test increases more than 10% after the submersion under water, compared with that of before submersion. In the present invention, it can be recognized that adsorption does not occur when the change of capacitance is very small.

TABLE 4

| Example No. | Precursor | Pore-generating material | Mat.[1] (wt. %) | Pore-generating[2] material (wt. %) | CP before submersion (pF) | CP after submersion (pF) |
|---|---|---|---|---|---|---|
| Example 7-1 | Precursor (A) | — | 25.0 | — | 22.14 | 22.72 |
| Example 7-2 | Precursor (A) | (a − 1) | 25.0 | 20 wt. % | 22.85 | 23.31 |
| Example 7-3 | Precursor (A) | (a − 2) | 25.0 | 20 wt. % | 27.82 | 27.48 |
| Example 7-4 | Precursor (A) | (a − 1) + (b − 2) | 25.0 | (a − 1): 10 wt. % + (b − 2): 20 wt. % | 27.85 | 24.82 |
| Example 7-5 | Precursor (A) | (a − 1) + (c) | 25.0 | (a − 1): 20 wt. % + (c): 10 wt. % | 25.22 | 24.09 |
| Example 7-6 | Precursor (A) | (a − 1) + (c) | 25.0 | (a − 1): 10 wt. % + (c): 20 wt. % | 24.43 | 24.90 |
| Example 7-7 | Precursor (A) | (a − 2) + (c) | 25.0 | (a − 2): 10 wt. % + (c): 20 wt. % | 9.68 | 9.65 |
| Example 7-8 | Precursor (B) | — | 30.0 | — | 6.49 | 6.55 |
| Example 7-9 | Precursor (B) | (a − 1) | 30.0 | 20 wt. % | 5.47 | 5.55 |
| Example 7-10 | Precursor (B) | (a − 1) | 30.0 | 30 wt. % | 6.04 | 6.12 |
| Example 7-11 | Precursor (B) | (a − 1) + (b − 1) | 30.0 | (a − 1): 10 wt. % + (b − 1): 20 wt. % | 6.64 | 6.72 |
| Example 7-12 | Precursor (B) | (a − 1) + (c) | 30.0 | (a − 1): 10 wt. % + (c): 20 wt. % | 8.33 | 8.15 |
| Example 7-13 | Precursor (B) | (a − 1) + (c) | 30.0 | (a − 1): 20 wt. % + (c): 10 wt. % | 8.81 | 8.41 |
| Example 7-14 | Precursor (A) | (b − 1) | 25.0 | 20 wt. % | 22.35 | 22.55 |
| Example 7-15 | Precursor (A) | (b − 1) + (c) | 25.0 | (b − 1): 10 wt. % + (c): 20 wt. % | 24.04 | 24.11 |
| Example 7-16 | Precursor (B) | (b − 1) | 30.0 | 20 wt. % | 5.44 | 5.43 |
| Example 7-17 | Precursor (B) | (b − 1) + (c) | 30.0 | (b − 1): 10 wt. % + (c): 20 wt. % | 7.22 | 7.21 |

Mat.[1](Wt. %) = [weight of matrix precursor (g) + weight of pore-generating material (g)/[weight of PGMEA (g) + weight of matrix precursor (g) + weight of pore-generating material (g)] × 100
Pore-generating material[2](wt. %) = weight of pore-generating material (g)/[weight of pore-generating material (g) + weight of matrix precursor (g)] × 100

EXAMPLE 8

Measurement of Mechanical Proportions—Hardness and Modulus of the Thin-Film

Hardness and modulus of the thin-film prepared in the same process as in Example 5 are measured by Nanoindenter II of MS Co. The hardness and modulus are measured when the intended depth is 10% of whole thin film thickness. Further, each sample of the thin films is indented to 6 points and the hardness and modulus of the thin film are determined from the mean value in order to ensure confidence. The thickness of the thin film is measured by a prism coupler. The results are described in Table 5.

TABLE 5

| Example No. | Precursor | Pore-generating material | Mat.[1] (wt. %) | Pore-generating[2] material (wt. %) | Thickness (Å) | Hardness (Gpa) | Modulous (Gpa) |
|---|---|---|---|---|---|---|---|
| Example 8-1 | Precursor (A) | — | 25.0 | — | 8400 | 9.84 | 0.86 |
| Example 8-2 | Precursor (A) | (a − 1) | 25.0 | 10 wt. % | 9100 | 6.74 | 0.76 |
| Example 8-3 | Precursor (A) | (a − 1) | 25.0 | 20 wt. % | 9900 | 5.41 | 0.61 |
| Example 8-4 | Precursor (A) | (a − 1) | 25.0 | 30 wt. % | 10300 | 3.41 | 0.47 |
| Example 8-5 | Precursor (A) | (a − 2) | 25.0 | 30 wt. % | 9800 | 3.42 | 0.48 |
| Example 8-6 | Precursor (A) | (a − 1) + (c) | 25.0 | (a − 1): 10 wt. % + (c): 20 wt. % | 10020 | 3.35 | 0.39 |
| Example 8-7 | Precursor (A) | (a − 1) + (c) | 25.0 | (a − 1): 20 wt. % + (c): 10 wt. % | 9700 | 3.34 | 0.38 |
| Example 8-8 | Precursor (A) | (a − 1) + (b − 1) | 25.0 | (a − 1): 20 wt. % + (b − 1): 10 wt. % | 9800 | 3.43 | 0.48 |
| Example 8-9 | Precursor (A) | (a − 2) + (b − 1) | 25.0 | (a − 0): 20 wt. % + (b − 1): 10 wt. % | 11000 | 3.45 | 0.47 |
| Example 8-10 | Precursor (B) | — | 30.0 | — | 9600 | 9.68 | 0.87 |
| Example 8-11 | Precursor (B) | (a − 1) | 30.0 | 20 wt. % | 11030 | 4.71 | 0.57 |
| Example 8-12 | Precursor (B) | (a − 1) | 30.0 | 30 wt. % | 11500 | 3.31 | 0.41 |
| Example 8-13 | Precursor (B) | (a − 1) + (b − 1) | 30.0 | (a − 1): 10 wt. % + (b − 1): 20 wt. % | 11000 | 3.40 | 0.45 |
| Example 8-14 | Precursor (B) | (a − 1) + (c) | 30.0 | (a − 1): 10 wt. % + (c): 20 wt. % | 10700 | 3.19 | 0.40 |
| Example 8-15 | Precursor (B) | (a − 1) + (c) | 30.0 | (a − 1): 20 wt. % + (c): 10 wt. % | 11200 | 3.31 | 0.37 |
| Example 8-16 | Precursor (A) | (b − 1) | 25.0 | 20 wt % | 9500 | 5.51 | 0.62 |
| Example 8-17 | Precursor (A) | (b − 1) + (c) | 30.0 | (b − 1): 10 wt % + (c): 20 wt % | 9400 | 3.47 | 0.41 |
| Example 8-18 | Precursor (B) | — | 30.0 | — | 9600 | 9.68 | 0.87 |
| Example 8-19 | Precursor (B) | (b − 1) | 30.0 | 10 wt % | 10100 | 6.46 | 0.74 |
| Example 8-20 | Precursor (B) | (b − 1) | 30.0 | 20 wt % | 11000 | 4.92 | 0.59 |
| Example 8-21 | Precursor (B) | (b − 1) | 30.0 | 30 wt % | 11700 | 3.36 | 0.45 |
| Example 8-22 | Precursor (B) | (b − 2) | 30.0 | 10 wt % | 9500 | 5.88 | 0.80 |
| Example 8-23 | Precursor (B) | (b − 2) | 30.0 | 20 wt % | 9900 | 4.70 | 0.53 |
| Example 8-24 | Precursor (B) | (b − 2) | 30.0 | 30 wt % | 10100 | 3.20 | 0.42 |
| Example 8-25 | Precursor (B) | (b − 1) + (c) | 30.0 | (b − 1): 10 wt % + (c): 20 wt % | 10050 | 3.18 | 0.43 |
| Example 8-26 | Precursor (B) | (b − 1) + (c) | 30.0 | (b − 1): 20 wt % + (c): 10 wt % | 11000 | 3.44 | 0.42 |

Mat.[1](Wt. %) = [weight of matrix precursor (g) + weight of pore-generating material (g)/[weight of PGMEA (g) + weight of matrix precursor (g) + weight of pore-generating material (g)] × 100

Pore-generating material[2](wt. %) = weight of pore generating material (g)/[weight of pore-generating material (g) + weight of matrix precursor (g)] × 100

The present invention provides materials having pores produced by the use of the composition of the present invention. These materials can be used as heat resisting materials, electric insulators, absorbents, carriers for catalysts and the like. In particular, these substances may be useful for insulating films between interconnecting layers of semiconductor devices, since their dielectric constant, k is 2.5 or less.

Any modifications and changes of the present invention which can be made by a person having ordinary skill in the relevant art are intended to be encompassed within the scope of the present invention.

What is claimed is:

1. A composition for preparing a porous dielectric thin film which comprises:
   (1) a pore generating material of gemini detergent represented by the formula (8), quaternary alkyl ammonium salt represented by the formula (9) or mixture thereof;
   (2) thermo-stable organic or inorganic matrix precursor; and
   (3) a solvent for dissolving both the said material and/or salt and the matrix precursor:

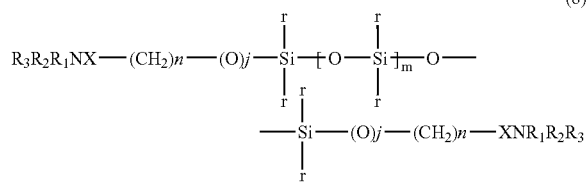

(8)

wherein
$R_1$ and $R_2$ are independently a methyl group or a ethyl group;
$R_3$ is a $C_{5\sim40}$ alkyl group;
X is a halogen atom;
r is independently a hydrogen atom, a methyl group or a $C_{1\sim10}$ alkoxy group;
j is 0 or 1;
n is an integer from 1 to 12, and
m is an integer from 0 to 10, and $$NL_1L_2L_3L_4X \quad (9)$$

wherein
N is a nitrogen atom;
X is a halogen atom; and
$L_1$, $L_2$, $L_3$, and $L_4$ are independently a $C_{1\sim30}$ alkyl group.

2. The composition according to claim 1, wherein the content of the pore-generating material is 0.1~95 wt. % of the solid components (the pore-generating material+the matrix precursor).

3. The composition according to claim 1, wherein the content of the solvent is 20.0~99.9 wt. % of the composition (the matrix precursor+the pore-generating material+the solvent).

4. The composition according to claim 1, wherein the pore-generating material further comprises a cyclodextrin derivative represented by the formula (12).

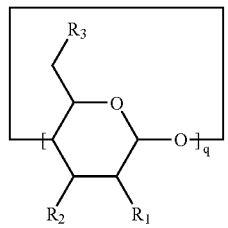

(12)

wherein,
q is an integer ranging from 6 to 12;
$R_1$, $R_2$ and $R_3$ are independently a halogen atom, a $C_{0\sim10}$ amino group or a azido group, a $C_{3\sim20}$ imidazole group or a pyridino group, a $C_{1\sim10}$ cyano group, a $C_{2\sim10}$ carbonate group, a $C_{1\sim10}$ carbamate group or a functional group represented by —$OR_4$, wherein
$R_4$ is a hydrogen atom, a $C_{2\sim30}$ acyl group, a $C_{1\sim20}$ alkyl group, a $C_{3\sim10}$ alkene group, a $C_2$ alkyne group, a $C_{7\sim20}$ tosyl group, a $C_{1\sim10}$ mesyl group, a $C_{0\sim10}$ phosphorous group, a $C_{3\sim10}$ cycloalkyl group, a $C_{6\sim30}$ aryl group, a $C_{1\sim20}$ hydroxy alkyl group, a carboxyl group, a $C_{1\sim20}$ carboxy alkyl group, a glucosyl group or a maltosyl group, or silicon compounds represented by $Sir_1r_2r_3$, wherein $r_1$, $r_2$ and $r_3$ are independently a $C_{1\sim5}$ alkyl group, a $C_{1\sim5}$ alkoxy group, or a $C_{6\sim20}$ aryl group.

5. The composition according to claim 4, wherein the cyclodextrin derivative is selected from the group consisting of α-, β- or γ-cyclodextrin derivatives represented by the formulae (13) to (15):

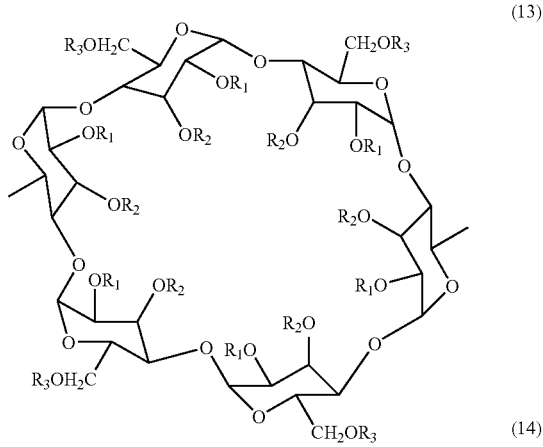

(13)

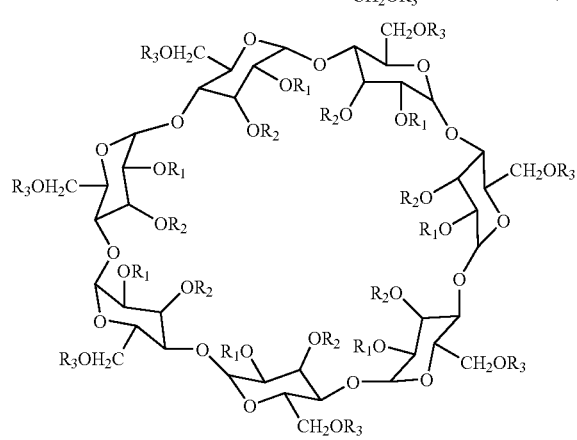

(14)

-continued (15)

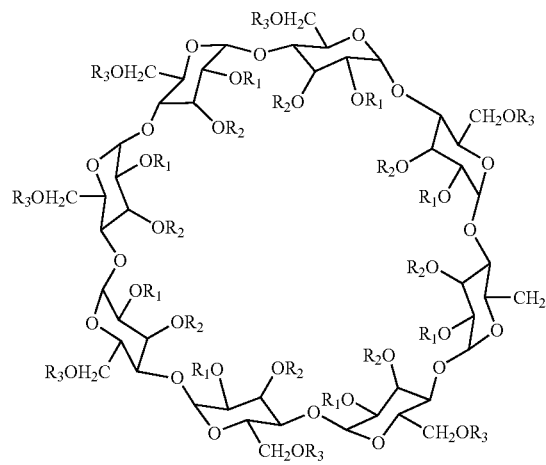

wherein,
R$_1$, R$_2$ and R$_3$ are independently a halogen atom, a C$_{0\sim10}$ amino group or an azido group, a C$_{3\sim20}$ imidazole group or a pyridino group, a C$_{1\sim10}$ cyano group, a C$_{2\sim10}$ carbonate group, a C$_{1\sim10}$ carbamate group or a functional group represented by —OR$_4$, wherein
R$_4$ is a hydrogen atom, a C$_{2\sim30}$ acyl group, a C$_{1\sim20}$ alkyl group, a C$_{3\sim10}$ alkene group, a C$_2$ alkyne group, a C$_{7\sim20}$ tosyl group, a C$_{1\sim10}$ mesyl group, a C$_{0\sim10}$ phosphorous group, a C$_{3\sim10}$ cycloalkyl group, a C$_{6\sim30}$ aryl group, a C$_{1\sim20}$ hydroxy alkyl group, a carboxyl group, a C$_{1\sim20}$ carboxyl alkyl group, a glucosyl group or a maltosyl group, or silicon compounds represented by the formula Sir$_1$r$_2$r$_3$, wherein r$_1$, r$_2$ and r$_3$ are independently a C$_{1\sim5}$ alkyl group, a C$_{1\sim5}$ alkoxy group, or a C$_{6\sim20}$ aryl group.

6. The composition according to claim 4, wherein the content of the cyclodextrin derivative is 5~95 wt. % of the total pore-generating material.

7. The composition according to claim 1, wherein the quaternary alkyl ammonate is selected from the group consisting of tetramethylammonium bromide, tetraethylammonium bromide, tetrapropylammonium bromide, tetrabutylammonium bromide, tetrapentylammonium bromide, tetrahexylammonium bromide, tetraheptylammonium bromide, tetraoctylammonium bromide, tetrahexadecylammonium bromide, tetraoctadecylammonium bromide, diethyldimethylammonium bromide, dipropyldimethylammonium bromide, dibutyldimethylammonium bromide, dipentyldimethylammonium bromide, dihexyldimethylammonium bromide, diheptyldimethylammonium bromide, dioctyldimethylammonium bromide, and didecyldimethylammonium bromide.

8. The composition according to claim 1, wherein the matrix precursor is selected from the group consisting of silsesquioxane, an alkoxysilane sol and a siloxane-based resin.

9. The composition according to claim 8, wherein the silsesquioxane is selected from the group consisting of hydrogen silsesquioxane, an alkyl silsesquioxane, an aryl silsesquioxane, and a copolymer thereof.

10. The composition according to claim 1, wherein the matrix precursor is siloxane-based resin which is prepared by hydrolysis and polycondensation of at least one monomer selected from the group consisting of compounds represented by the following formulas (1) to (4) in an organic solvent in the presence of a catalyst and water:

(1)

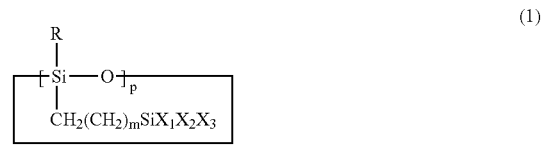

wherein,
R is a hydrogen atom, a C$_{1\sim3}$ alkyl group, a C$_{3\sim10}$ cycloalkyl group, or a C$_{6\sim15}$ aryl group;
X$_1$, X$_2$ and X$_3$ are independently a C$_{1\sim3}$ alkyl group, a C$_{1\sim10}$ alkoxy group, or a halogen atom; at least one thereof being hydrolysable; and
p is an integer from 3 to 8; m is an integer from 0 to 10, and (2)

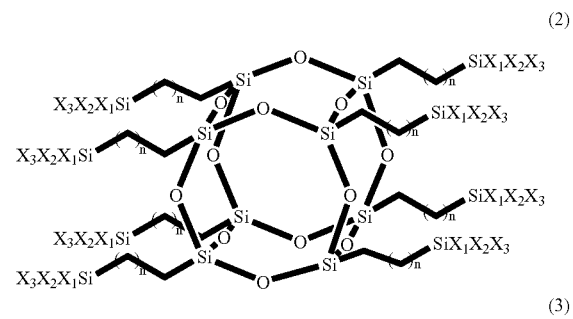

(3)

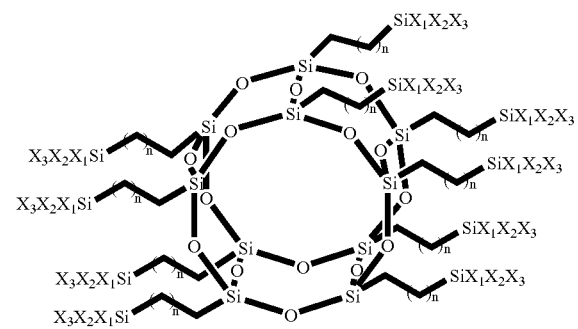

(4)

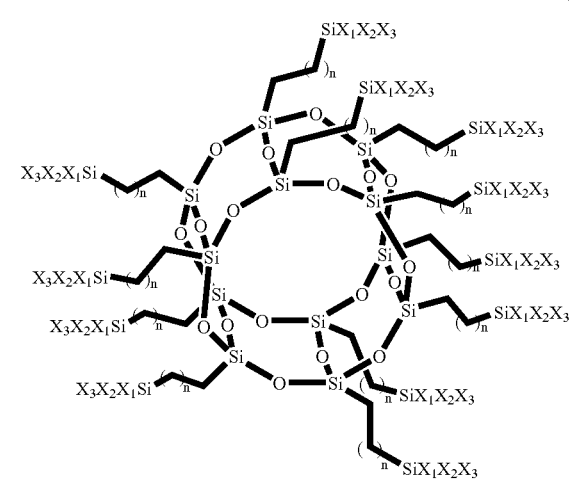

wherein,

R is a hydrogen atom;

$X_1$, $X_2$ and $X_3$ are independently a hydrogen atom, a $C_{1~3}$ alkyl group, a $C_{1~10}$ alkoxy group, or halogen atom; at least one thereof being hydrolysable and n is an integer from 1 to 10.

11. The composition according to claim 1, wherein the matrix precursor is siloxane-based resin which is prepared by hydrolysis and polycondensation of at least one monomer selected from the group consisting of compounds represented by the following formulas (1) to (4) together with at least one silane-based monomer selected from the group consisting of compounds represented by the following formulas (5) to (7) in an organic solvent in the presence of a catalyst and water:

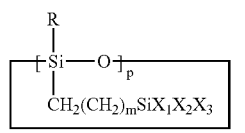

(1)

wherein,

R is a hydrogen atom, a $C_{1~3}$ alkyl group, a $C_{3~10}$ cycloalkyl group, or a $C_{6~15}$ aryl group;

$X_1$, $X_2$ and $X_3$ are independently a $C_{1~3}$ alkyl group, a $C_{1~10}$ alkoxy group, or halogen atom; at least one thereof being hydrolysable;

p is an integer from 3 to 8; and m is an integer from 0 to 10, and

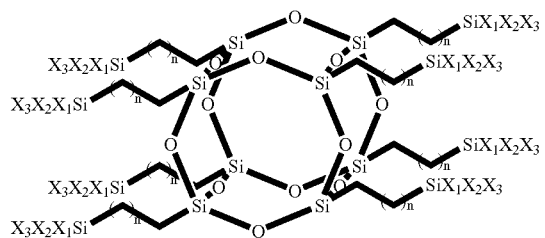

(2)

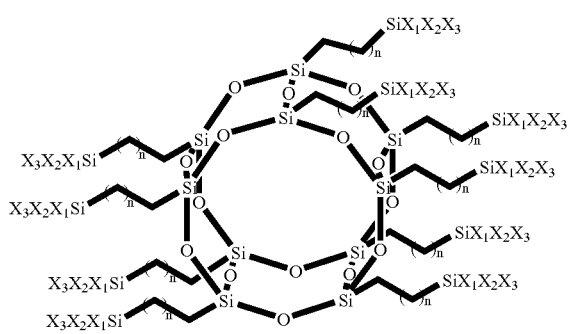

(3)

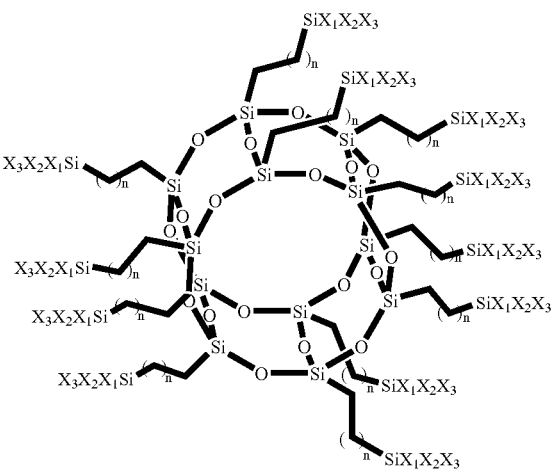

(4)

wherein, $X_1$, $X_2$ and $X_3$ are independently a hydrogen atom, a $C_{1~3}$ alkyl group, a $C_{1~10}$ alkoxy group, or halogen atom; at least one thereof being hydrolysable;

n is an integer from 1 to 10, and $$RSiX_1X_2X_3 \qquad (5)$$

$$RSiX_1X_2X_3 \qquad (6)$$

$$R_1R_2SiX_1X_2 \qquad (7)$$

wherein, $R_1$ and $R_2$ are independently a hydrogen atom, a $C_{1~3}$ alkyl group, a $C_{3~10}$ cycloalkyl group, or a $C_{6~15}$ aryl group;

$X_1$, $X_2$ and $X_3$ are independently a $C_{1~3}$ alkyl group, a $C_{1~10}$ alkoxy group, or a halogen atom.

12. The composition according to claim 10, wherein the content of Si—OH of the matrix precursor is more than 10 mol %.

13. The composition according to claim 11, wherein the content of Si—OH of the matrix precursor is more than 10 mol %.

14. The composition according to claim 11, wherein the mole ratio of siloxane monomers having cyclic or cage structure to the silane-based monomers is 0.99:0.01~0.01:0.99.

15. The composition according to claim 1, wherein the matrix precursor is a polyimide, polybenzocyclobutene, a polyarylene, or a mixture thereof.

16. The composition according to claim 1, wherein the solvent is selected from the group consisting of an aromatic hydrocarbon-based solvent, a ketone-based solvent, an ether-based solvent, an acetate-based solvent, an amide-based solvent, γ-butyrolactone, an alcohol-based solvent, a silicon-based solvent, and mixtures thereof.

* * * * *